US006836397B2

United States Patent
Chen et al.

(10) Patent No.: US 6,836,397 B2
(45) Date of Patent: Dec. 28, 2004

(54) ELECTROSTATIC DISCHARGE PROTECTION APPARATUS FOR A CIRCUIT BOARD

(75) Inventors: Sheng-Guo Chen, Taipei (TW); Cheng-Nan Chen, Taipei (TW)

(73) Assignee: Arima Computer Corporation (TW)

( * ) Notice: Subject to any disclaimer, the term of this patent is extended or adjusted under 35 U.S.C. 154(b) by 0 days.

(21) Appl. No.: 10/442,104

(22) Filed: May 21, 2003

(65) Prior Publication Data

US 2004/0233596 A1 Nov. 25, 2004

(51) Int. Cl.[7] .............................................. H01H 47/00
(52) U.S. Cl. ...................... 361/220; 361/780; 174/259
(58) Field of Search ................. 174/255–262; 361/111, 816, 818, 56, 212, 220, 780, 792, 794, 795; 29/830, 846

(56) References Cited

U.S. PATENT DOCUMENTS

| 5,818,101 A | * | 10/1998 | Schuster ..................... 257/659 |
| 5,825,606 A | * | 10/1998 | Villain et al. ............... 361/220 |
| 6,541,988 B2 | * | 4/2003 | Dangelmayer et al. ..... 324/754 |

* cited by examiner

Primary Examiner—Ronald Leja

(57) ABSTRACT

An electrostatic discharge protection apparatus for a circuit board is described. The electrostatic discharge protection apparatus has a nonconductive layer and a conductive layer. The conductive layer is used to dissipate electric charges accumulated on the pointed ends of the circuit board, and thus improves the electrostatic discharge protection ability of the circuit board.

15 Claims, 3 Drawing Sheets

ELECTROSTATIC DISCHARGE PROTECTION APPARATUS FOR A CIRCUIT BOARD

BACKGROUND OF THE INVENTION

1. Field of Invention

The present invention relates to an electrostatic discharge protection apparatus. More particularly, the present invention relates to an electrostatic discharge protection apparatus for a circuit board.

2. Description of Related Art

Electronic devices, such as monitors, notebook computers, mobile telephones, are easily damaged by electrostatic discharge (ESD) that affects normal operations of these electronic devices. The transient voltage induced by electrostatic discharge is very large, and as the scale of integrated circuit elements is reduced, the threshold electrostatic voltage that may cause electrostatic discharge also becomes smaller. In practical operations, some high-speed electronic devices may be damaged when the magnitude of the electrostatic discharge is only 30 V.

Electrostatic discharge occurs because an electric field formed by charged objects ionizes neighborhoring gases to induce discharge. Both conductors and nonconductors can induce and accumulate electric charges. Generally, a material with low resistance easily dissipates electric charges, but a material with high resistance dissipates electric charges with difficulty. For this reason, nonconductors very easily accumulate electrostatic charges. Artificial polymers, like plastics, are able to gather and keep electrostatic charges for a long time due to their high resistance.

Electrostatic discharges include direct electrostatic discharges and indirect electrostatic discharges. The direct electrostatic discharges are further divided into contact discharge and air discharge according to their different discharging methods. The indirect electrostatic discharges are also further divided into horizontal coupling place (HCP) discharge and vertical coupling place (VCP) discharge.

Contact discharge is point discharge, such when as a screwdriver damages electronic devices, and mainly occurs in a joint of two metal pieces or a surface of one metal piece. Air discharge is human body discharge, such as when a finger damages electronic devices, and generally occurs on a nonconductive surface, like the case of an electronic device, or a surface that is often be touched by fingers, like a keyboard.

Manufacturers usually apply ESD tests to electronic devices to ensure their resistance to electrostatic discharge and ability to maintain stable work conditions. The environment of the ESD test is a temperature of: 15° C.–35° C., a relative humidity of: 30%–60% and an atmospheric pressure of: 68 Kpa (680 mbar)–106 Kpa (1060 mbar). The ESD test simulates electrostatic discharge to test whether electronic devices can effectively avoid electrostatic discharge under different discharge conditions.

FIG. 1 illustrates a schematic view of a circuit board, such as a mainboard 100, and in particular a view of a side without any chip of the mainboard 100. The mainboard 100 includes several screw holes, and screws fasten the mainboard 100 to something through the screw holes. Moreover, the mainboard 100 also comprises multiple input/output ports (I/O ports) 104 and slots 106.

The screws, the I/O ports 104 and the slot 106 all accumulate electric charges, and their ends are pointed. Charged objects easily discharge from their pointed end when they gather electric charges. The screws, the I/O ports 104 and the slot 106 therefore very easily discharge, and then damage the electronic element on the mainboard 100.

Generally, a circuit board includes several ground layers inside to dissipate the electric charges accumulated on its charged objects. Because of the trade-off with cost, sometimes the circuit board contains only 6 layers instead of the conventional 8 layers. The 6-layer circuit board has one less ground layer than the conventional 8-layer circuit board, so the electrostatic discharge protection ability of the 6-layer circuit board decreases substantially. Thus the slayer circuit board usually can't pass the ESD test before it leaves the factory.

SUMMARY OF THE INVENTION

It is therefore an objective of the present invention to provide an electrostatic discharge protection apparatus for a circuit board, that satisfies this need to improve the electrostatic discharge protection ability of the circuit board.

In accordance with the foregoing and other objectives of the present invention, an electrostatic discharge protection apparatus for a circuit board is described. The electrostatic discharge protection apparatus for a circuit board is placed in the neighborhood of some pointed ends of the circuit board, such as screws, I/O ports or slots. The electric charges accumulated on the pointed ends therefore dissipate by jumping to the electrostatic discharge protection apparatus, and thus the electric charges accumulated are prevented from inducing discharge.

In one preferred embodiments of the present inventions, a nonconductive layer contacts a backside of a mainboard, and a conductive layer contacts the opposite side of the nonconductive layer.

The material of the nonconductive layer is insulating and plastic, for example, polyethylene terephthalate (PET) is appropriate as a material of the nonconductive layer. The material of the conductive layer is aluminum, copper, or other metal that is conductive and processed easily.

The conductive layer of the preferred embodiment further comprises a ground port. The conductive layer is coupled with a ground end by the ground port to enlarge the effective area of the conductive layer dissipating and containing the electric charges.

The nonconductive layer comprises several openings corresponding to the screw holes of the mainboard. Similarly, the conductive layer also comprises several openings corresponding to the screw holes of the mainboard.

Moreover, the apparatus of the invention comprises the same functional openings for other pointed ends on the mainboard 100, like I/O ports and the slots.

The area of the conductive layer can be used to modify the electrostatic discharge protection ability of the apparatus.

The nonconductive layer and the mainboard can be fixed together to avoid relative movement therebetween that would reduce the electrostatic discharge protection ability. The nonconductive layer and the conductive layer can do this as well. In this preferred embodiment, an adhesive element, like glue, is used to fix them.

In conclusion, the present invention improves the electrostatic discharge protection ability of the conventional circuit board, and is a cheap and simple apparatus for the circuit board. Utilizing the present invention on a circuit board allows the circuit board to pass an ESD test before it leaves the factory even as the circuit board structure shrinks from 8 layers to 6 layers. The cost of a 6-layer circuit board with this apparatus is only about a quarter of the cost of a slayer circuit board with 2 additional ground layers inside. Therefore, the apparatus of the present invention not only saves costs, but also helps the circuit board pass the ESD test.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
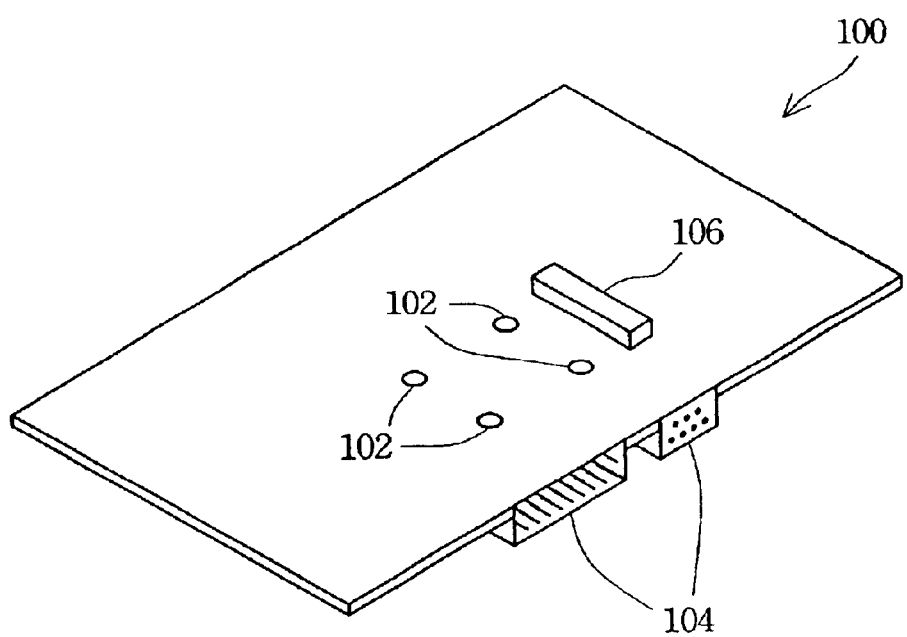
FIG. 1 illustrates a schematic view of a conventional circuit board.

Reference will now be made in detail to the present preferred embodiments of the invention, examples of which are illustrated in the accompanying drawings. Wherever possible, the same reference numbers are used in the drawings and the description to refer to the same or like parts.

The present invention provides an electrostatic discharge protection apparatus for a circuit board to improve the electrostatic discharge protection ability of the circuit board.

Grounding is the most effective and efficient way to avoiding electrostatic is discharge. The electric charges accumulated on an object discharging all energies in one electrostatic discharge is the main reason for the fatal damaging caused by electrostatic discharge. Accordingly, connecting all objects together, then grounding, and keeping resistance low therebetween consequently dissipates electric charges accumulated thereon to the ground, and thus avoids the damage caused by electrostatic discharge.

The present invention provides an electrostatic discharge protection apparatus for a circuit board in the neighborhood of some pointed ends of the circuit board, such as screws, 110 ports or slots. The electric charges accumulated on the pointed ends therefore dissipate by jumping to the electrostatic discharge protection apparatus, and thus the electric charges accumulated are prevented from inducing discharging.

Figure 2A:
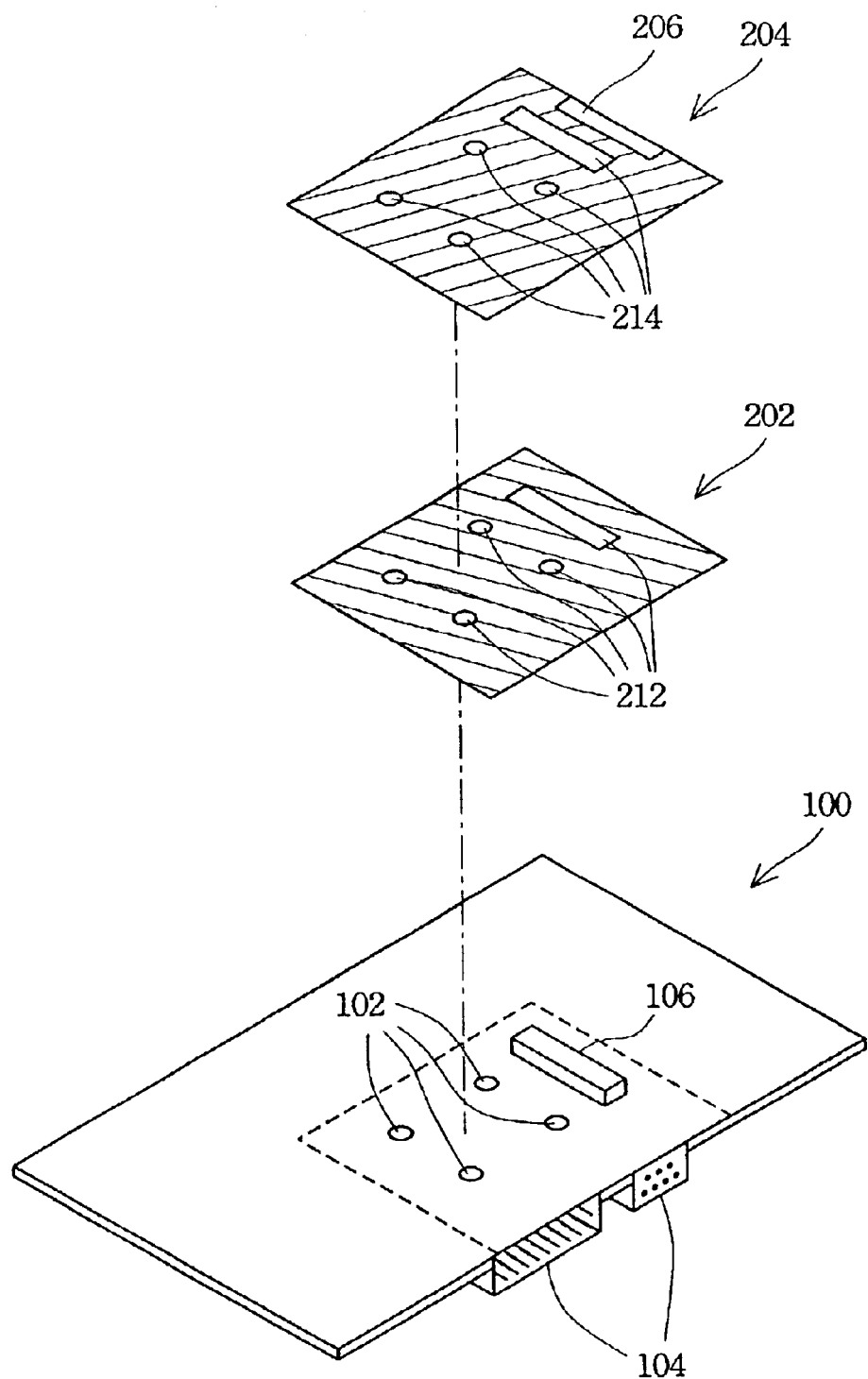
FIG. 2A illustrates a schematic, exploded view of one preferred embodiment of this invention.

FIG. 2A illustrates a schematic view of one preferred embodiment of this invention. A nonconductive layer 202 contacts a backside of a mainboard 100, and a conductive layer 204 contacts the opposite side of the nonconductive layer 202. The nonconductive layer 202 and the conductive layer 204 are placed in the neighborhood of the pointed ends of the mainboard 100, such as screw holes 102 for a screw, I/O ports 104 and a slot 106, which easily induce electrostatic discharge. By this configuration, electric charges accumulated on the pointed ends jumps to the electrostatic discharge protection apparatus of the invention through the shortest path, and are dissipated to other places.

In the preferred embodiment, the material of the nonconductive layer 202 is insulating and plastic; for example, polyethylene terephthalate (PET) is an appropriate material of the nonconductive layer 202. The function of the nonconductive layer 202 is mainly to insulate the mainboard 100 and conductive layer 204. As a result, electronic elements on the mainboard 100 do not contact the conductive layer 204 to create a short. In addition, the nonconductive layer 202 further prevents the conductive layer 204 from being stabbed by the electronic elements on the mainboard 100. The material of the conductive layer 204 is aluminum, copper, or other metal that is conductive and processed easily.

The conductive layer 204 of the preferred embodiment further comprises a ground port 206. The conductive layer 204 is coupled with a ground end by the ground port 206 to enlarge the effective area of the conductive layer 204 dissipating and containing the electric charges. Thus the electrostatic discharge protection ability of the apparatus is improved. The ground end used to enlarge the effective area can be a ground end of a power source, a case of an electronic device or a ground layer of the mainboard 100, and is not limited to a real ground.

The nonconductive layer 202 comprises several opening 212 corresponding to the screw holes 102 of the mainboard 100. Similarly, the conductive layer 204 also comprises several opening 214 corresponding to the screw holes 102 of the mainboard 100. A screw fastens the mainboard 100 through the opening 212 and 214. The conductive layer 212 near the opening 212 and 214 forms a shortest path for the electric charges accumulated on the screw and the slot 106; thus the electric charges easily jump and are dissipated to conductive layer 204.

Figure 2B:
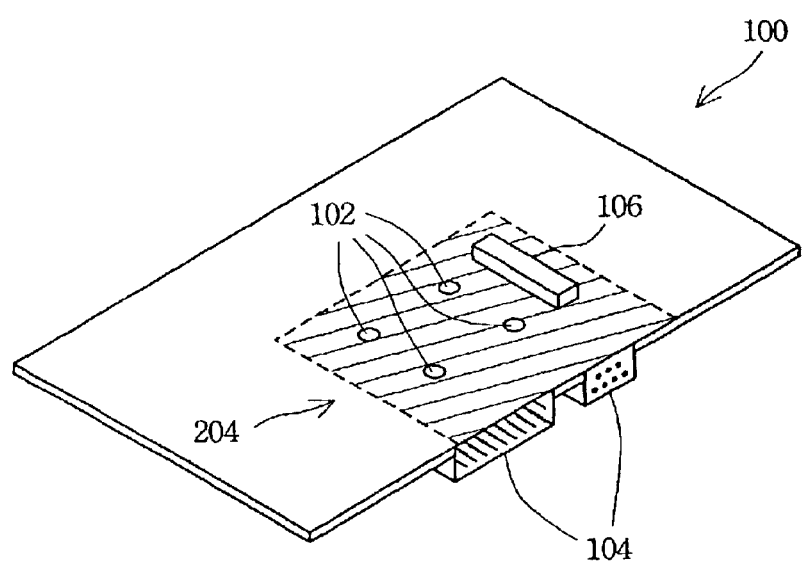
FIG. 2B illustrates a schematic view according of one preferred embodiment of this invention.

FIG. 2B illustrates a schematic view for combining the nonconductive layer 202, conductive layer 204, and mainboard 100 in FIG. 2A to more clearly explain the preferred embodiment. Moreover, as illustrated by FIG. 2B, the apparatus of the invention comprises the same functional opening 212 and 214 for other pointed ends on the mainboard 100, like the I/O port 104 and the slot 106. The openings 212 and 214 are also designed to have shapes similar to the pointed ends to provide the shortest path for the electric charges to jump to the conductive layer 204.

The area of the conductive layer 204 can be used to modify the electrostatic discharge protection ability of the apparatus. The demands of manufacturers or electronic elements for electrostatic discharge protection are different; modifying the area of the conductive layer 204 satisfies these different demands easily. When the area of the conductive 204 is larger, the number of the electric charges accumulated thereon is greater, and the electrostatic discharge protection ability is better. On the contrary, when the area of the conductive 204 is smaller, the number of the electric charges accumulated thereon is smaller, and the electrostatic discharge protection ability is worse.

The nonconductive layer 202 and the mainboard 100 can be fixed together to avoid relative movement therebetween that would reduce the electrostatic discharge protection ability. The nonconductive layer 202 and the conductive layer 204 can do this as well. In this preferred embodiment, an adhesive element, like glue, is used to fix the nonconductive layer 202 and the mainboard 100 together, as well as the nonconductive layer 202 and the conductive layer 204. However, other adhesive elements or methods that do not short mainboard 100 and conductive layer 204 also can be used in the present invention.

In conclusion, the present invention improves the electrostatic discharge protection ability of the conventional circuit board, and is a cheap and simple apparatus for the circuit board. As the circuit board structure shrinks from 8 layers to 6 layers, utilizing the present invention on the circuit board allows the circuit board to pass an ESD test before it leaves the factory. The cost of a 6-layer circuit board with this apparatus is only about a quarter of the cost of a 6-layer circuit board with 2 additional ground layers inside. Therefore, the apparatus of the present invention not only saves costs, but also helps the circuit board pass the ESD test.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection apparatus for a circuit board having at least one pointed end, the electrostatic discharge protection apparatus comprising:

a nonconductive layer, in contact with a backside of the circuit board, and the nonconductive layer comprises a first opening; and a conductive layer, in contact with the nonconductive layer, and the conductive layer comprises a second opening, wherein the pointed end passes through the first and the second openings to dissipate electric charges accumulated on the pointed end by to the conductive layer.

2. The electrostatic discharge protection apparatus of claim 1, wherein a material of the nonconductive layer comprises insulating material.

3. The electrostatic discharge protection apparatus of claim 1, wherein a material of the nonconductive layer comprises PET.

4. The electrostatic discharge protection apparatus of claim 1, wherein a material of the conductive layer comprises metal.

5. The electrostatic discharge protection apparatus of claim 1, wherein a material of the conductive layer comprises copper.

6. The electrostatic discharge protection apparatus of claim 1, wherein a material of the conductive layer comprises aluminum.

7. The electrostatic discharge protection apparatus of claim 1, wherein an area of the conductive layer is a predetermined area and the predetermined area is used to modify an electrostatic discharge protection ability of the electrostatic discharge protection apparatus.

8. The electrostatic discharge protection apparatus of claim 1, wherein the nonconductive layer is fixed on the circuit board by an adhesive element.

9. The electrostatic discharge protection apparatus of claim 8, wherein the adhesive element is glue.

10. The electrostatic discharge protection apparatus of claim 1, wherein the conductive layer is fixed on the nonconductive layer by an adhesive element.

11. The electrostatic discharge protection apparatus of claim 10, wherein the adhesive element is glue.

12. The electrostatic discharge protection apparatus of claim 1, wherein the electrostatic discharge protection apparatus for the circuit board further comprises a ground port, the ground port is coupled with a ground end, and the conductive layer dissipates charges to the ground end by the ground port.

13. The electrostatic discharge protection apparatus of claim 12, wherein the ground end is a ground layer inside the circuit board.

14. The electrostatic discharge protection apparatus of claim 12, wherein the ground end is a ground end of a power source.

15. The electrostatic discharge protection apparatus of claim 12, wherein the ground end is a case of an electronic device.

* * * * *